United States Patent
Lu et al.

(10) Patent No.: US 10,475,838 B2
(45) Date of Patent: Nov. 12, 2019

(54) MULTI-PIXEL DETECTOR AND ASSOCIATED METHOD FOR INCREASING ANGULAR SENSITIVITY

(71) Applicant: OmniVision Technologies, Inc., Santa Clara, CA (US)

(72) Inventors: Chen-Wei Lu, San Jose, CA (US); Yin Qian, Milpitas, CA (US); Chin Poh Pang, Pleasanton, CA (US); Boyang Zhang, San Jose, CA (US)

(73) Assignee: OmniVision Technologies, Inc., Santa Clara, CA (US)

( * ) Notice: Subject to any disclaimer, the term of this patent is extended or adjusted under 35 U.S.C. 154(b) by 0 days.

(21) Appl. No.: 15/714,502

(22) Filed: Sep. 25, 2017

(65) Prior Publication Data

US 2019/0096945 A1    Mar. 28, 2019

(51) Int. Cl.
*H01L 27/146*    (2006.01)
(52) U.S. Cl.
CPC .. *H01L 27/14627* (2013.01); *H01L 27/14685* (2013.01); *H01L 27/14621* (2013.01)
(58) Field of Classification Search
CPC ......... H01L 27/14627; H01L 27/14685; H01L 27/14621
USPC ...................................................... 257/432
See application file for complete search history.

(56) References Cited

U.S. PATENT DOCUMENTS

| | | | |
|---|---|---|---|
| 7,605,980 B2 | 10/2009 | Kim et al. | |
| 2007/0264424 A1* | 11/2007 | Wang | B29D 11/00365 427/162 |
| 2009/0034083 A1* | 2/2009 | Li | G02B 3/0031 359/619 |
| 2013/0070060 A1* | 3/2013 | Chatterjee | H04N 5/2258 348/47 |
| 2013/0170012 A1* | 7/2013 | Ellis-Monaghan | G02B 5/201 359/291 |

FOREIGN PATENT DOCUMENTS

| | | | | |
|---|---|---|---|---|
| WO | WO-03005274 A1 * | 1/2003 | ......... | G06K 7/10544 |
| WO | WO-2014133974 A1 * | 9/2014 | ......... | H04N 5/2252 |

* cited by examiner

*Primary Examiner* — Hrayr A Sayadian
(74) *Attorney, Agent, or Firm* — Lathrop Gage LLP

(57) ABSTRACT

An image sensor includes a multi-pixel detector. The multi-pixel detector includes a first pixel formed in a substrate and having a first photodiode region, a second pixel formed in the substrate adjacent to the first pixel and having a second photodiode region, and a microlens above both the first pixel and the second pixel. The microlens includes (a) in a first cross-sectional plane perpendicular to a top surface of the substrate and including both the first and the second photodiode regions, a first height profile having $N_1$ local maxima, and (b) in a second cross-sectional plane perpendicular to the first cross-sectional plane and the top surface and including only one of the first and the second photodiode regions, a second height profile having $N_2 > N_1$ local maxima.

6 Claims, 8 Drawing Sheets

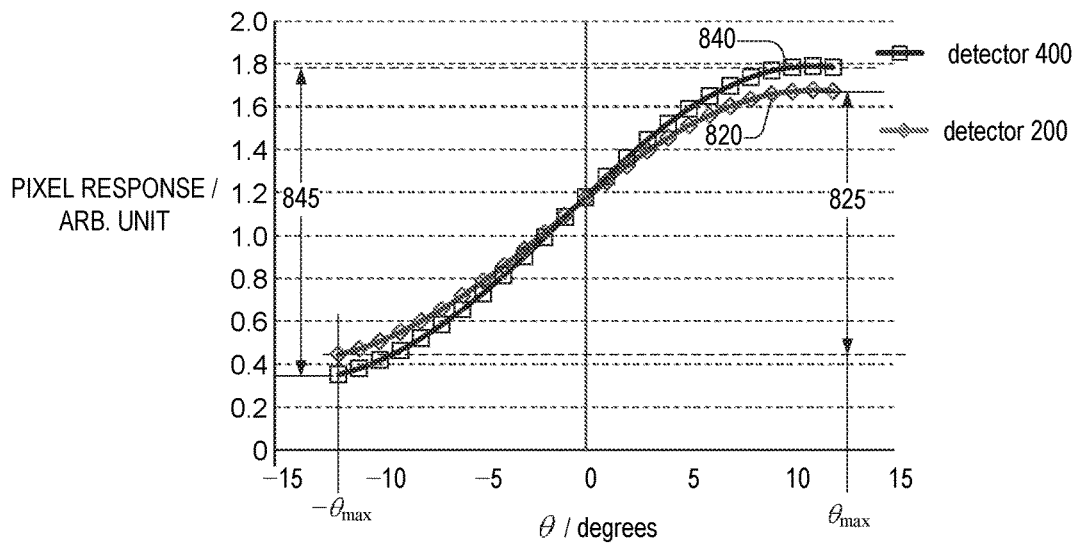
FIG. 8
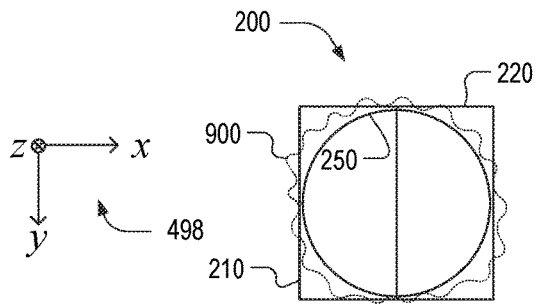 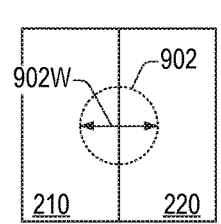 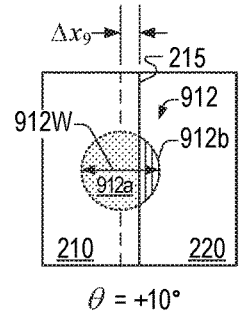
FIG. 9A  FIG. 9B  FIG. 9C
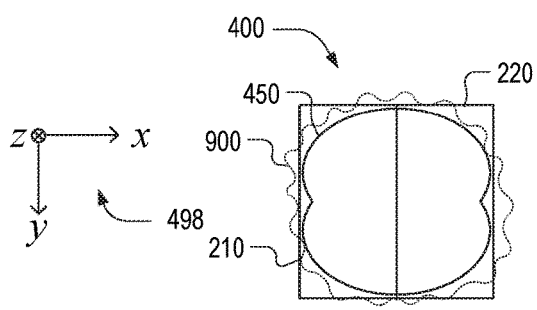 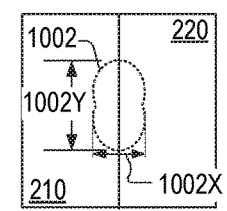 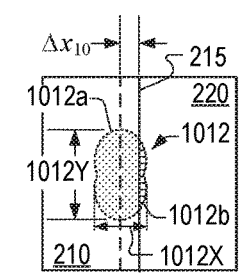
FIG. 10A  FIG. 10B  FIG. 10C

US 10,475,838 B2

MULTI-PIXEL DETECTOR AND ASSOCIATED METHOD FOR INCREASING ANGULAR SENSITIVITY

BACKGROUND

Many digital cameras have autofocus capability. Autofocus may be fully automatic such that the camera identifies objects in the scene and focuses on the objects. In some cases, the camera may determine which objects are more important than other objects and subsequently focus on the more important objects. Alternatively, autofocus may utilize user input specifying which portion or portions of the scene are of interest. Based thereupon, the autofocus function identifies objects within the portion(s) of the scene, specified by the user, and focuses the camera on such objects.

To achieve market adoption, the autofocus function must be reliable and fast such that every time a user captures an image, the camera quickly brings the desired portion, or portions, of the scene into focus. Preferably, the autofocus function is sufficiently fast that the user does not notice any delay between pressing the trigger button and image capture. The autofocus is particularly important for cameras having no means for manual focus, such as compact digital cameras and camera phones.

To this end, camera manufacturers are developing image sensors with on-chip phase detection, i.e., image sensors with integrated phase detection capability via the inclusion of phase-detection auto-focus (PDAF) pixels in the image sensor's pixel array.

SUMMARY OF THE EMBODIMENTS

In one aspect, an image sensor includes a multi-pixel detector. The multi-pixel detector includes a first pixel formed in a substrate and having a first photodiode region, a second pixel formed in the substrate adjacent to the first pixel and having a second photodiode region, and a microlens above both the first pixel and the second pixel. The microlens includes (a) in a first cross-sectional plane perpendicular to a top surface of the substrate and including both the first and the second photodiode regions, a first height profile having $N_1$ local maxima, and (b) in a second cross-sectional plane perpendicular to the first cross-sectional plane and the top surface and including only one of the first and the second photodiode regions, a second height profile having $N_2 > N_1$ local maxima.

In a second aspect, a method for increasing angular sensitivity of a multi-pixel detector to light incident thereon is disclosed. The multi-pixel detector has a substrate that includes a first photodiode region adjacent to a second photodiode region in a first direction. The method includes imparting a phase shift on the light such that the light has: in a cross-sectional plane intersecting the substrate, parallel to a top surface of the substrate, and including the first direction, an oblong intensity distribution that has (i) a first width in the first direction and (ii) in a second direction perpendicular to the first direction and in the cross-sectional plane, a second width the exceeds the first width.

In a third aspect, a method for forming a microlens includes forming, on a top substrate surface of a substrate, a block of a reflowable material having a top surface, opposite the top substrate surface, having a notch therein extending toward the top substrate surface. The method also includes thermally reflowing the block of material to yield the microlens.

BRIEF DESCRIPTION OF THE FIGURES

FIG. 8 is a graphical depiction of improved angular sensitivity of an embodiment of the PDAF pixel detector of FIG. 4 compared to PDAF pixel detector of FIG. 2.

FIG. 9A is a top plan view of the PDAF pixel detector of FIG. 2 with illumination incident on the microlens thereof. FIG. 9B and FIG. 9C illustrate the effect of the microlens on the incident illumination.

FIG. 10A is a top plan view of an embodiment of the PDAF pixel detector of FIG. 4 with illumination incident on the microlens thereof. FIG. 10B and FIG. 10C illustrate the effect of the microlens on the incident illumination, in an embodiment.

DETAILED DESCRIPTION OF THE EMBODIMENTS

Figure 1:
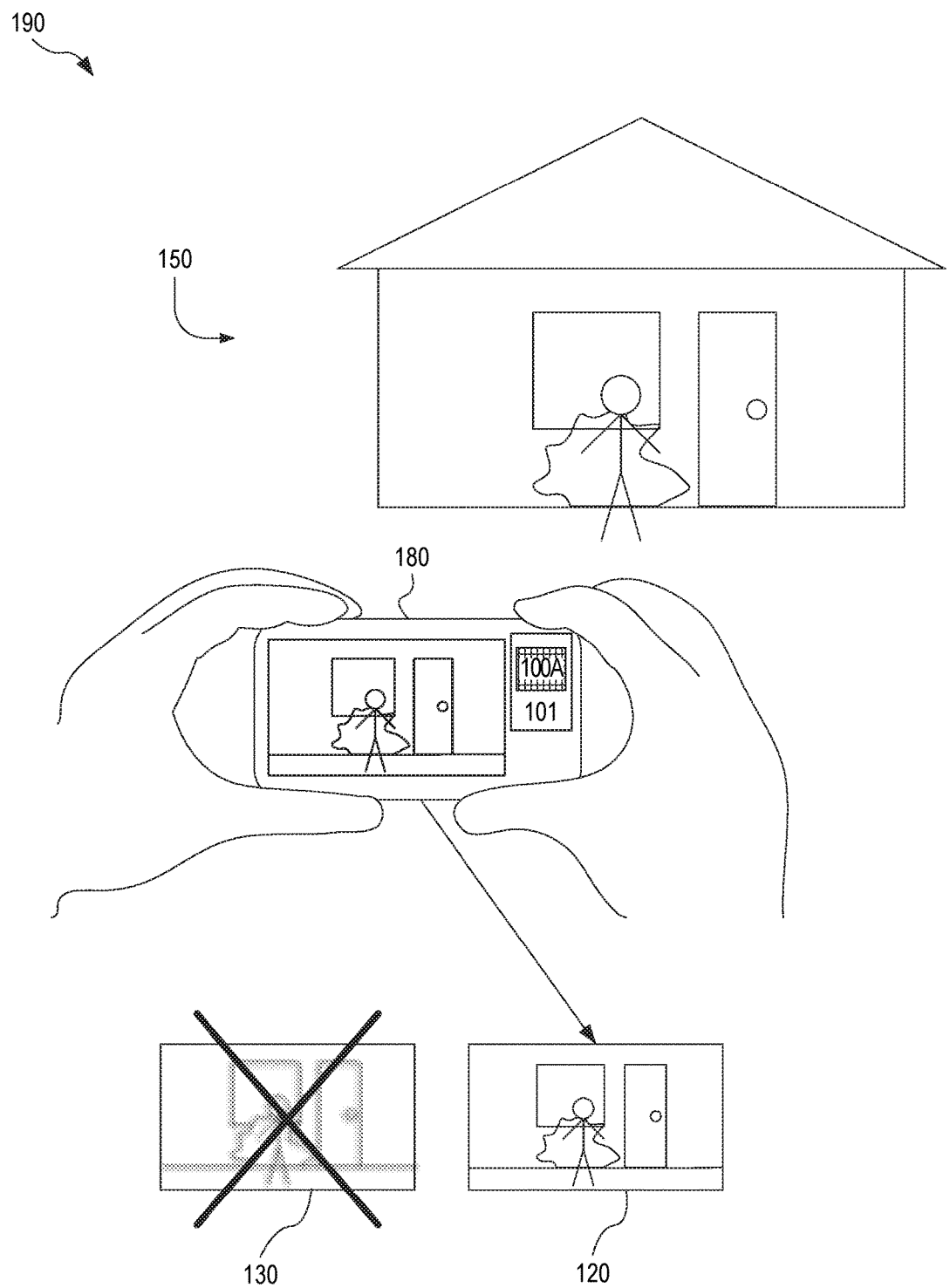
FIG. 1 illustrates one exemplary image sensor with PDAF pixels in an exemplary use scenario.

FIG. 1 illustrates one exemplary image sensor 101 with PDAF pixels in an exemplary use scenario 190. Image sensor 101 includes a pixel array 100A and is implemented in a digital camera 180 for imaging a scene 150. Digital camera 180 is, for example, a camera phone or a compact digital camera. Digital camera 180 utilizes the on-chip phase detection capability of image sensor 101 to focus on scene 150. When focused, digital camera 180 utilizes image sensor 101 to capture a focused image 120, instead of a defocused image 130, of scene 150.

Figure 2:
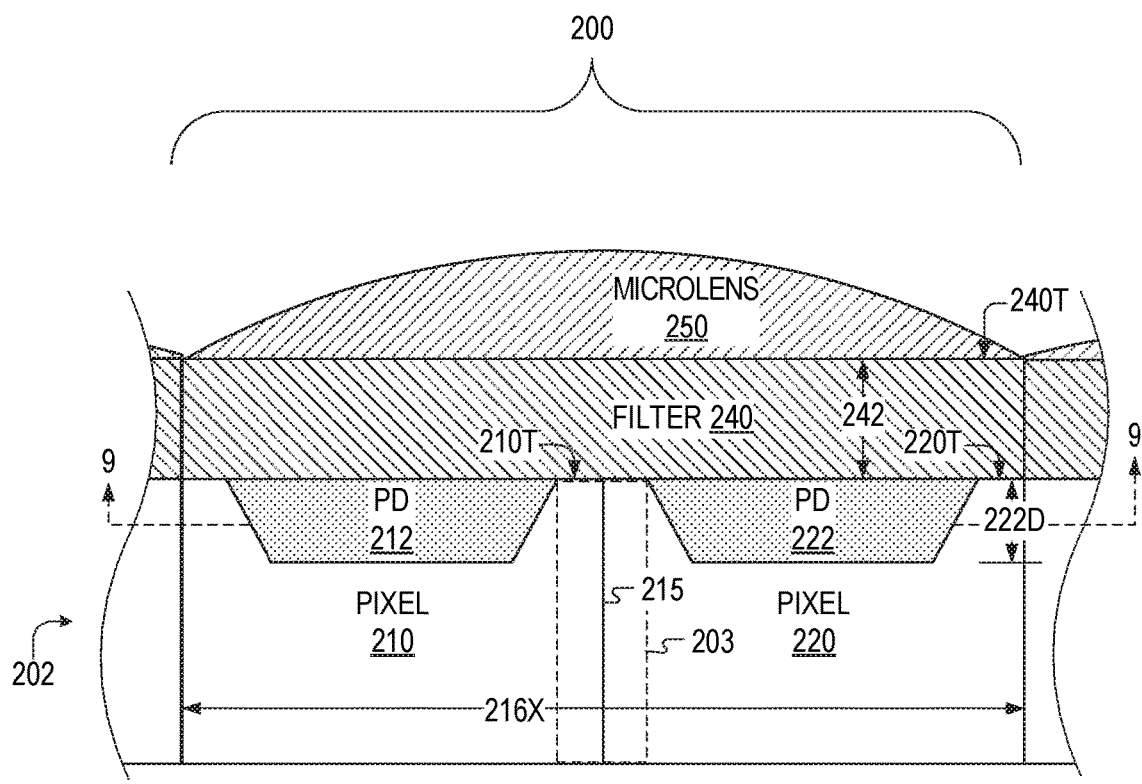
FIG. 2 is a cross-sectional view of a multi-pixel detector of the pixel array of FIG. 1.

In an embodiment, pixel array 100A includes at least one multi-pixel detector 200. FIG. 2 is a cross-sectional view of multi-pixel detector 200. Multi-pixel detector 200 includes pixels 210 and 220, which have a common color filter 240 and microlens 250. Pixels 210 and 220 are formed in a common substrate 202, which may be formed of one or more semiconductor materials.

Color filter 240 has a height 242 and a top surface 240T. Pixels 210 and 220 have respective top surfaces 210T and 220T. Pixels 210 and 220 have a combined detector width 216X. Pixels 210 and 220 have respective photodiode regions 212 and 222 separated by an inter-diode region 203 of substrate 202. A vertical line 215 denotes a plane equidistant from photodiode regions 212 and 222 of respective pixels 210 and 220. Photodiode regions 212 and 222 have a depth 222D.

Figure 3:
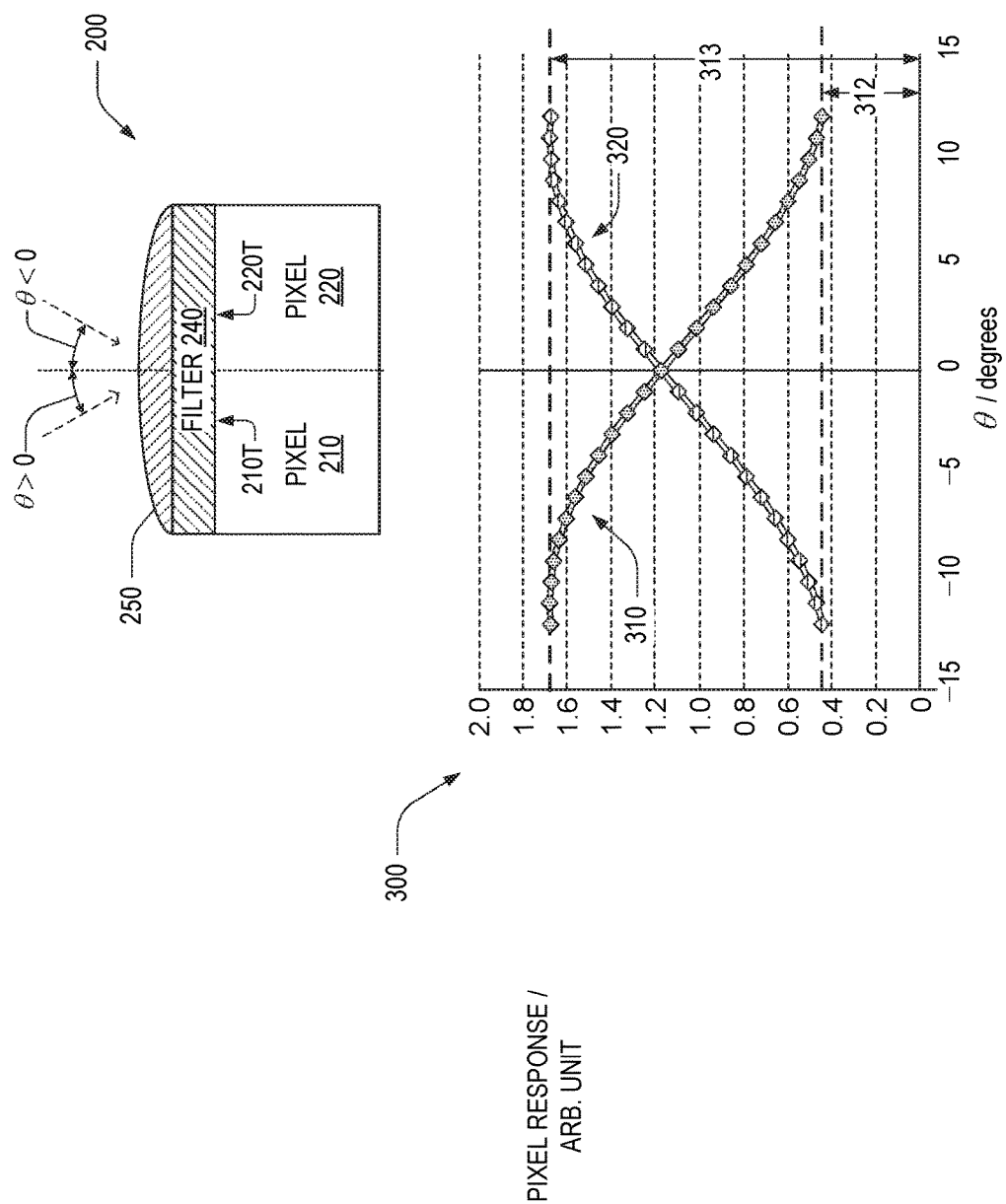
FIG. 3 is a schematic angular selectivity plot of the multi-pixel detector of FIG. 2.

Applicant has determined that the accuracy of PDAF depends on the angular sensitivity of multi-pixel detector 200. FIG. 3 is a simulated angular selectivity plot 300 of multi-pixel detector 200, where detector width 216X equals 1.0 μm and microlens 250 has a radius of curvature equal to 0.73 μm. Plot 300 includes pixel response 310 of left pixel 210 and pixel response 320 of right pixel 220 as a function of incident light angle θ, where θ=0 corresponds to light propagating perpendicular to surfaces 210T and 220T. Pixel 220 has a peak response for positive incident light angles θ>0. Pixel 210 has a peak response for negative incident light angles θ<0. Pixel responses 310 and 320 both have a minimum value 312 and a maximum value 313.

A metric of angular sensitivity of pixels 210 and 220, or equivalently multi-pixel detector 200, is the ratio of maximum value 313 to minimum value 312. In the simulation that produced plot 300, this maximum value 313 equals 1.65, and minimum value 312 equals 0.41, such that their ratio equals 4.02.

Figure 4:
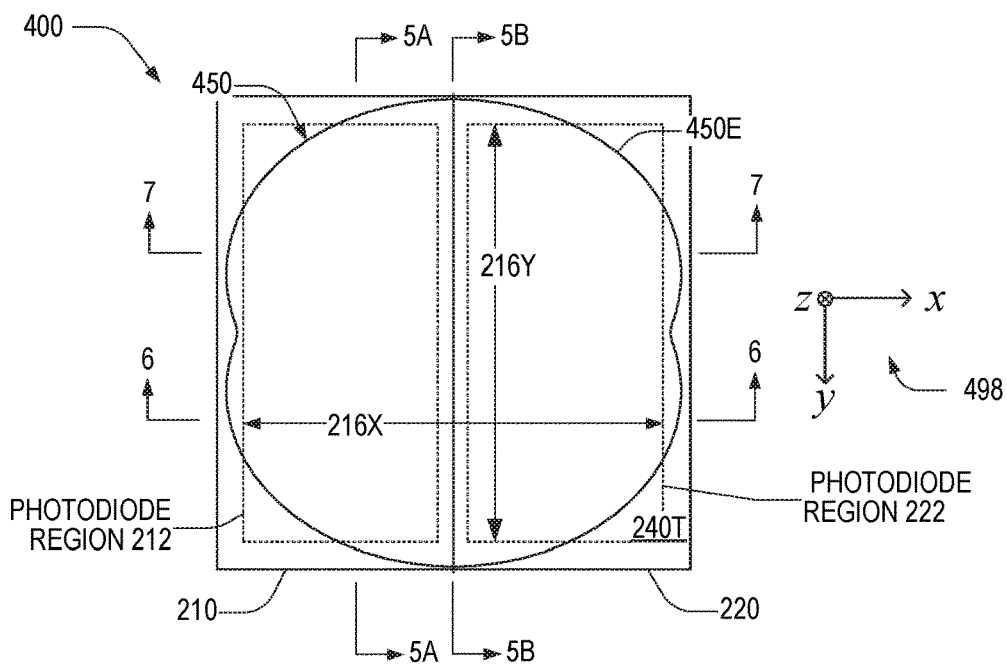
FIG. 4 is a plan view of a multi-pixel detector that includes a microlens for increasing angular sensitivity, in an embodiment.

FIG. 4 is a plan view of a multi-pixel detector 400. Multi-pixel detector 400 is similar to multi-pixel detector 200, except that microlens 250 is replaced by a microlens 450.

Figure 5:
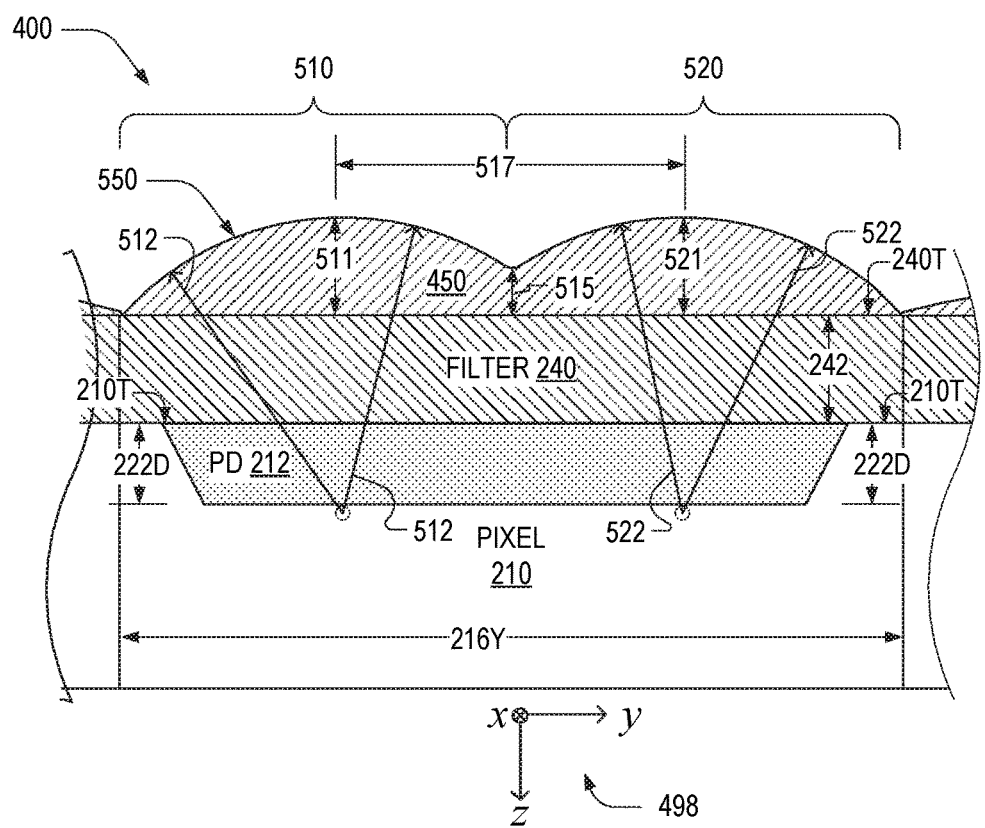
FIG. 5, FIG. 6, and FIG. 7 are cross-sectional views of the PDAF pixel detector of FIG. 4.
Figure 6:
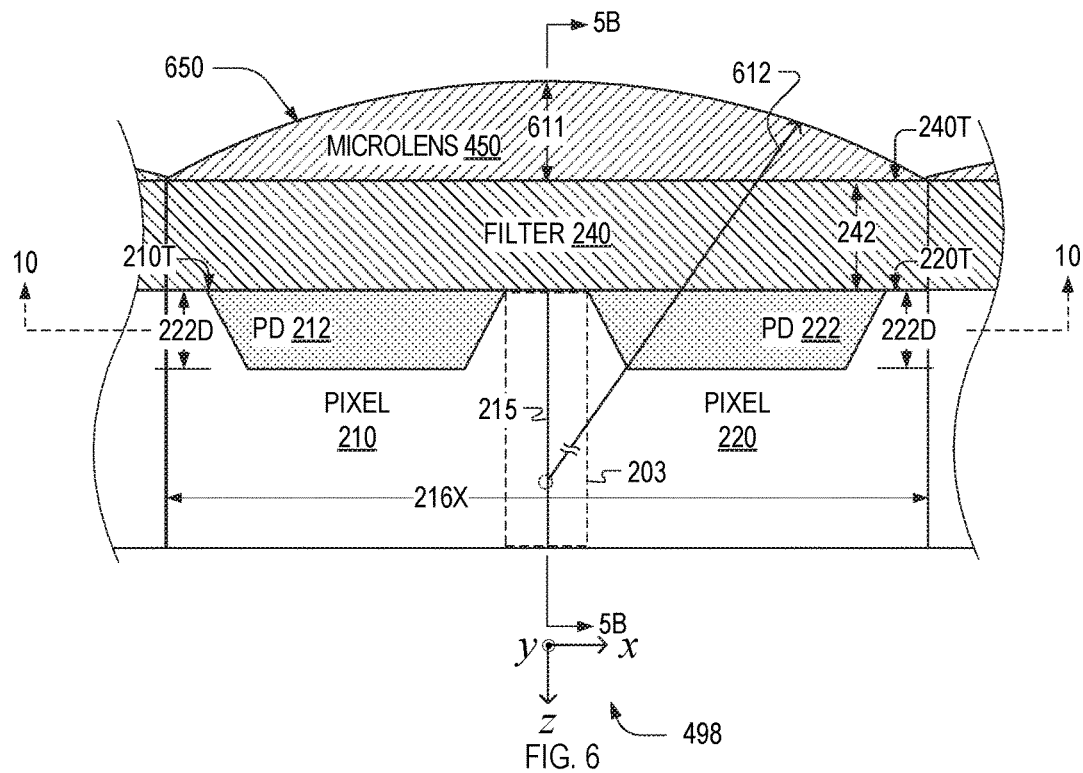
Figure 7:
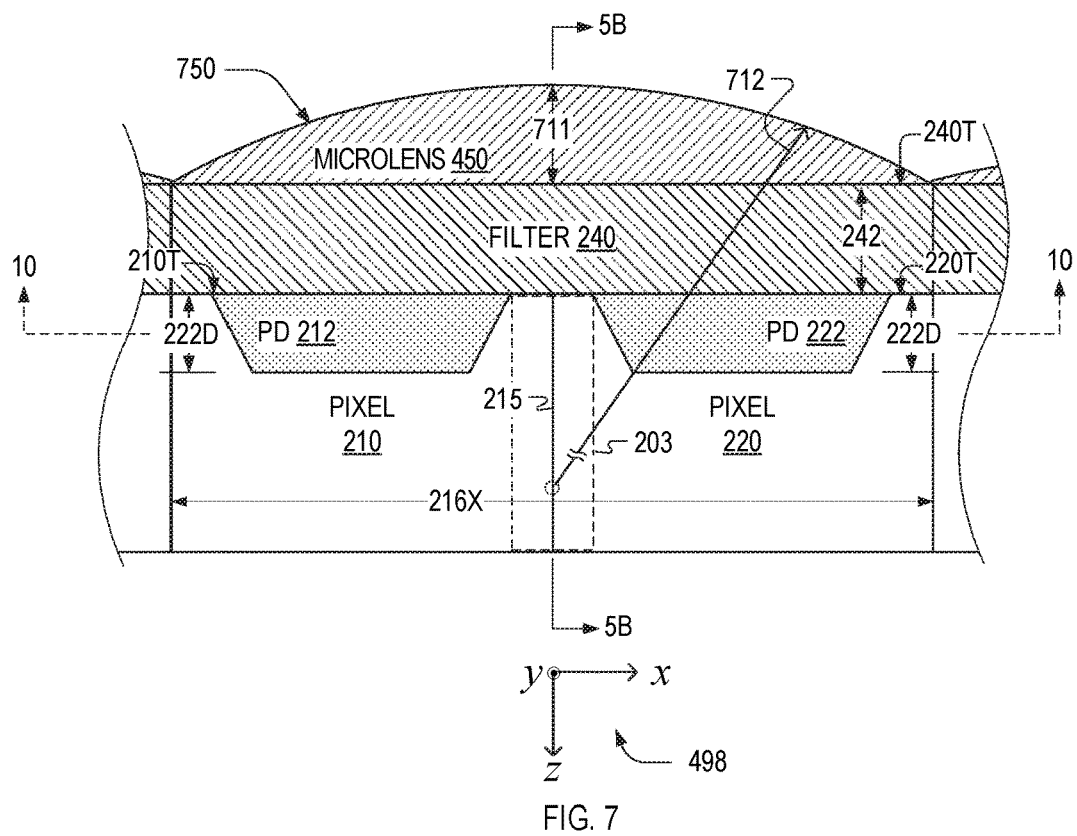

FIGS. 5-7 are cross-sectional views of multi-pixel detector 400 corresponding to cross-sectional planes 5A/5B, 6, and 7, respectively, shown in FIG. 4. FIGS. 4-7 illustrate multi-pixel detector 400 with respect to a coordinate system 498 formed by axes x, y, and z, where the x-y plane is parallel to top surface 240T. FIGS. 4-7 are best viewed together in the following description. While cross-sectional plane 5A traverses photodiode region 212, it may equivalently instead traverse photodiode region 222 or be at a cross-sectional plane 5B between photodiode regions 212 and 222. Herein and unless stated otherwise, references to directions or planes denoted by at least one of x, y, or z refer to coordinate system 498. Multi-pixel detector 400 has detector width 216X in the x direction and, in the y direction, a detector width 216Y, which may equal detector width 216X.

The plan view of FIG. 4 includes pixels 210 and 220 beneath surface 240T of filter 240. Microlens 450 is above surface 240T. Photodiode regions 212 and 222 are illustrated with dotted lines to illustrate their positions beneath filter 240 and relative to microlens 450. Microlens 450 has an outer edge 450E, which may extend to cover the entirety of photodiode regions 212 and 222.

Microlens 450 has a height profile 550 in the cross-sectional view of FIG. 5. Height profile 550 has regions 510 and 520 that have respective peak heights 511 and 521 above top surface 240T and respective radii of curvature 512 and 522. Peak heights 511 and 521 may be equal or unequal. Similarly, radii of curvature 512 and 522 may be equal or unequal. Peak heights 511 and 521 are separated by a distance 517 in a direction parallel to top surface 210T. The ratio of distance 517 to detector widths 216X, 216Y may be 0.50±0.05 such that microlens 450 scales with the size of pixels 210 and 220. Microlens 450 has a mid-height 515 that is greater than zero and less than each of peak heights 511 and 521.

Microlens 450 has height profile 650 and 750 in the cross-sectional views of FIG. 6 and FIG. 7, respectively. Height profiles 650 and 750 have respective peak heights 611 and 711 above top surface 240T and respective radii of curvature 612 and 712. Peak heights 611 and 711 may be equal or unequal. Similarly, radii of curvature 612 and 712 may be equal or unequal. While FIGS. 6 and 7 illustrate peak heights 611 and 711 as being above inter-diode region 203, one or both peak heights 611 and 711 may be above either photodiode region 212 or 222, or more generally, decentered with respect to photodiode regions 212 and 222. FIGS. 6 and 7 illustrate cross-sectional plane 5B of FIG. 5. When cross-sectional plane 5A is collocated with cross-sectional plane 5B, peak heights 611 and 711 may be equal to peak heights 511 and 521, respectively.

Each radius of curvature in the x-z plane (radii 612 and 712) may exceed both radii of curvature in the y-z plane (radii 512 and 522) such that microlens 450 has more focusing power in the y-z plane than in the x-z plane.

FIG. 8 is a graphical depiction of improved angular sensitivity of an embodiment of multi-pixel detector 400 compared to multi-pixel detector 200. In this example, microlens 250 of multi-pixel detector 200 has a radius of curvature equal to 0.73 μm. In this embodiment of multi-pixel detector 400, microlens 450 has radii of curvature 512 and 522 each equal 0.40±0.05 μm and radii of curvature 612 and 712 each equal to 0.58±0.05 μm, and detector widths 216X and 216Y both equal 1.0 μm.

As illustrated in FIGS. 2 and 6, respectively, multi-pixel detector 200 and multi-pixel detector 400 both include right pixel 220. FIG. 8 pixel response 820 and pixel response 840 of right pixel 220 in multi-pixel detector 200 and 400 respectively. Pixel responses 820 and 840 are a function of incident light angle θ, where θ=0 corresponds to light propagating perpendicular to surfaces 210T and 220T, as illustrated in FIG. 3. Incident light angle θ ranges from ±θ$_{max}$, which is approximately 12.5°. Pixel responses 820 and 840 span respective range 825 and 845 between ±θ$_{max}$. Range 845 exceeds range 825, which is an indicator that PDAF detector 400 has a greater angular sensitivity than multi-pixel detector 200.

FIG. 9A is a schematic plan view of multi-pixel detector 200, the view including microlens 250 and pixels 210 and 220. Illumination 900 is incident on microlens 250 at incident angle θ and propagates toward pixels 210 and 220. FIG. 3 illustrates incident angle θ.

FIG. 2 illustrates a cross-sectional plane 9 that is parallel to surfaces 210T and 220T and intersects photodiode regions 212 and 222. FIGS. 9B and 9C are cross-sectional views of multi-pixel detector 200 in the cross-sectional plane 9. When incident angle θ equals zero, microlens 250 imparts a phase shift upon illumination 900 such that it has an intensity distribution 902 in cross-sectional plane 9, as shown in FIG. 9B. Intensity distribution 902 has a diameter 902W and is centered on pixels 210 and 220 such that intensity distribution 902 is equally distributed between pixels 210 and 220.

When incident angle θ equals 10°, microlens 250 imparts a phase shift upon illumination 900 such that it has an intensity distribution 912 in cross-sectional plane 9, as shown in FIG. 9C. Intensity distribution 912 has a diameter 912W, which differs from diameter 902W by an insignificant amount for purposes of this discussion. Intensity distribution 912 is laterally offset from vertical line 215 by a distance Δx$_9$ such that it is unequally distributed between pixels 210 and 220. FIG. 9C illustrates two regions 912a and 912b of intensity distribution 912, which are located within pixels 210 and 220, respectively. Regions 912a and 912b have respective areas A$_{912a}$ and A$_{912b}$ and a have a ratio R$_{912}$=A$_{912a}$/A$_{912b}$. Diameters 902W and 912W may correspond to a full width at half maximum (FWHM) width or a 1/e² width of intensity distributions 902 and 912, respectively.

FIG. 10A is a schematic plan view of PDAF detector 400, the view including microlens 450 and pixels 210 and 220. Illumination 900 is incident on microlens 450 at incident angle θ and propagates toward pixels 210 and 220. FIG. 3 illustrates incident angle θ. Microlens 450 has a refractive index n and a complex amplitude transmittance $t(x,y)=\exp(-\phi(x,y))$, where phase shift $\phi(x,y)=nk_0 d(x,y)$, where $k_0=2\pi/\lambda_0$, $\lambda_0$ is a free-space wavelength included in illumination 900, and $d(x,y)$ is a thickness function of microlens 450. Complex amplitude transmittance $t(x,y)$ determines the nature of a phase shift that microlens 450 imparts on illumination 900 transmitted therethrough. Height profiles 550, 650, and 750 of FIGS. 5-7 are graphical illustrations of thickness function $d(x,y)$ in selected cross-sections.

In an embodiment, microlens 450 is a biplanar graded-index slab with a constant thickness $d_g$ and a spatially varying refractive index $n_g(x,y)$, where $n_g(x,y) \cdot d_g = n \cdot d(x,y)$. In this example, the biplanar graded-index slab imparts a phase shift $\phi_g(x,y) = \phi(x,y)$.

FIGS. 10B and 10C are cross-sectional views of PDAF detector 400 in a cross-sectional plane 10 of FIGS. 6 and 7. When illumination 900 propagates through microlens 450 at normal incidence (θ equals zero), microlens 450 imparts a phase shift upon illumination 900 such that it has an intensity distribution 1002 in cross-sectional plane 9, as shown in FIG. 10B. Intensity distribution 1002 has a maximum width 1002X, a height 1002Y (in directions x and y respectively), and is centered on pixels 210 and 220 such that intensity distribution 1002 is equally distributed between pixels 210 and 220. Intensity distribution 1002 and intensity distribution 902 may have equal area.

When illumination 900 propagates through microlens 450 at an incidence angle θ=10°, microlens 450 imparts a phase shift upon illumination 900 such that it has an intensity distribution 1012 in cross-sectional plane 10, as shown in FIG. 10C. Intensity distribution 1012 has a maximum width 1012W and a height 1012Y (in directions x and y respectively), which differ from maximum width 1002X and height 1002Y, respectively by an insignificant amount for purposes of this discussion. Widths 1002X and 1012W may correspond to a full width at half maximum (FWHM) width or a $e^{-2}$ width of intensity distributions 1002 and 1012, respectively.

Intensity distribution 1012 is laterally offset from vertical line 215 by distance $\Delta x_{10}$ such that it is unequally distributed between pixels 210 and 220. FIG. 10C illustrates two regions 1012a and 1012b of intensity distribution 1012, which are located within pixels 210 and 220, respectively. Regions 1012a and 1012b have respective areas $A_{1012a}$ and $A_{1012b}$ and a have a ratio $R_{1012}=A_{1012a}/A_{1012b}$. Ratio $R_{1012}$ exceeds ratio $R_{912}$ because maximum width 1002X of intensity distribution 1002 is less than diameter 902W of intensity distribution 902. This inequality holds, for example, when $\Delta x_9 = \Delta x_{10}$. This difference in ratios $R_{912}$ and $R_{1012}$ illustrates PDAF detector 400's higher angular sensitivity compared to multi-pixel detector 200, shown in FIG. 8, because changes in incident angle θ results in larger differences in pixel responses between adjacent pixels 210 and 220.

Figure 11:
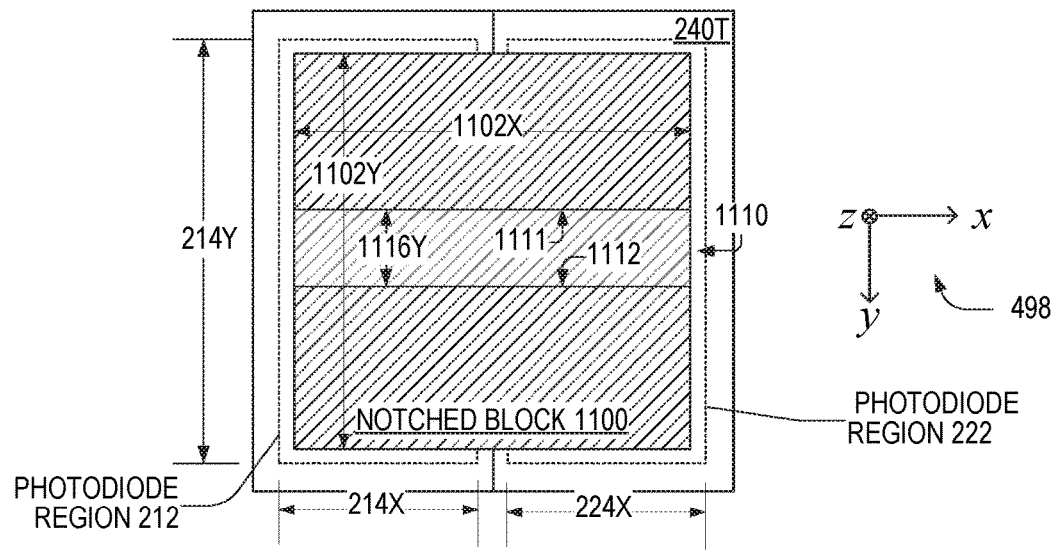
FIG. 11 is a plan view of a notched block on a top surface of a color filter of the multi-pixel detector of FIG. 4, in an embodiment.
Figure 12:
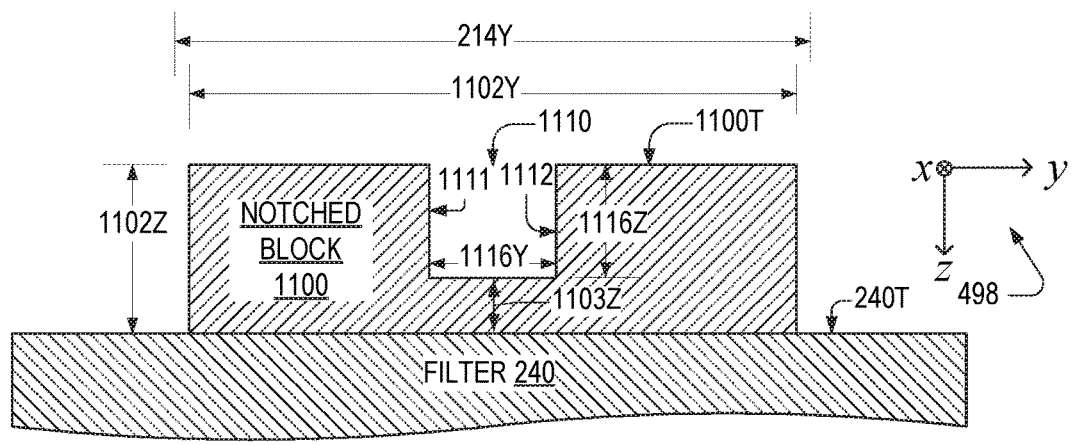
FIG. 12 is a cross-sectional view of the notched block of FIG. 11.

Microlens 450 may be formed by submitting a notched block of material to a thermal reflow process. FIGS. 11 and 12 illustrate an example of such a notched block 1100. FIG. 11 is a plan view of a notched block 1100 on top surface 240T of color filter 240. FIG. 12 is a cross-sectional view of notched block 1100 in the y-z plane of coordinate system 498. Microlens 450 and notched block 1100 may be formed of a material having a having a glass transition temperature $T_g$ between $T_{min}=140°$ C. and $T_{max}=180°$ C., which enables formation of microlens 450 via a thermal reflow process. Notched block 1110 and microlens 450 are formed of a positive photoresist, for example. In an embodiment, pixels 210 and 220, and respective photodiode regions 212 and 222, are beneath color filter 240. Photodiode regions 212 and 222 have respective widths 214X and 224X and a common extent 214Y.

Notched block 1100 has spatial dimensions 1102X, 1102Y, and 1102Z. Notched block 1100 has a notch 1110 along the x direction defined by sidewalls 1111 and 1112. Notch 1110 has a width 1116Y between sidewalls 1111 and 1112 and a depth 1116Z from a top surface 1100T. Width 1116Y may be less than spatial dimension 1102X. While FIG. 11 illustrates notch 1110 as having a dimension 1102X, notch 1110 may have a length less than dimension 1102X without departing from the scope hereof.

Notched block 1100 has a thickness 1103Z within notch 1110. Thickness 1103Z may equal zero such that notched block 1100 is only nominally a single block, as it includes, in this instance, two distinct and spatially-separate blocks.

Figure 13:
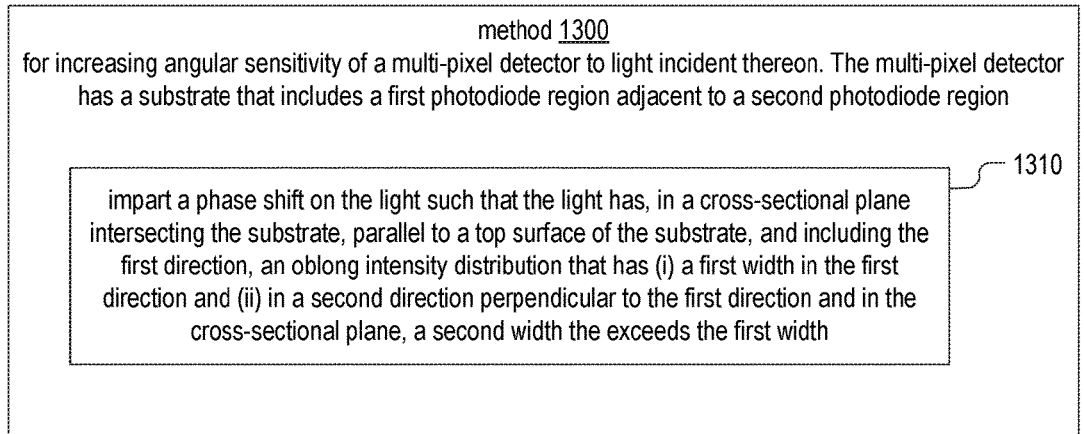
FIG. 13 is a flowchart illustrating a method for increasing angular sensitivity of a multi-pixel detector to light incident thereon, in an embodiment.

FIG. 13 is a flowchart illustrating a method 1300 for increasing angular sensitivity of a multi-pixel detector to light incident thereon. The multi-pixel detector has a substrate that includes a first photodiode region adjacent to a second photodiode region.

Method 1300 includes a step 1310. Step 1310 is one of imparting a phase shift on the light such that the light has, in a cross-sectional plane intersecting the substrate, parallel to a top surface of the substrate, and including the first direction, an oblong intensity distribution that has a first width, in the first direction, that is less than a second width in a second direction perpendicular to the first direction.

In an example of step 1310, microlens 450 imparts a phase shift on illumination 900 incident on PDAF detector 400. Light transmitted through microlens 450 has, in cross-sectional plane 10 (FIGS. 6 and 7), intensity distribution 1002. Intensity distribution 1002 has maximum width 1002X and height 1002Y, which correspond to the first width and second width of step 1310.

In step 1310, the phase shift may have (i) in the first direction, an absolute value having $N_1$ local maxima and (ii) in the second direction, an absolute value having $N_2 > N_1$ local maxima. For example, microlens 450 imparts phase shift $\phi(x,y)$ on incident illumination 900, where phase shift $\phi(x,y)$, by virtue of thickness function $d(x,y)$, has one local maximum in the x direction, and two local maxima in the y direction.

Figure 14:
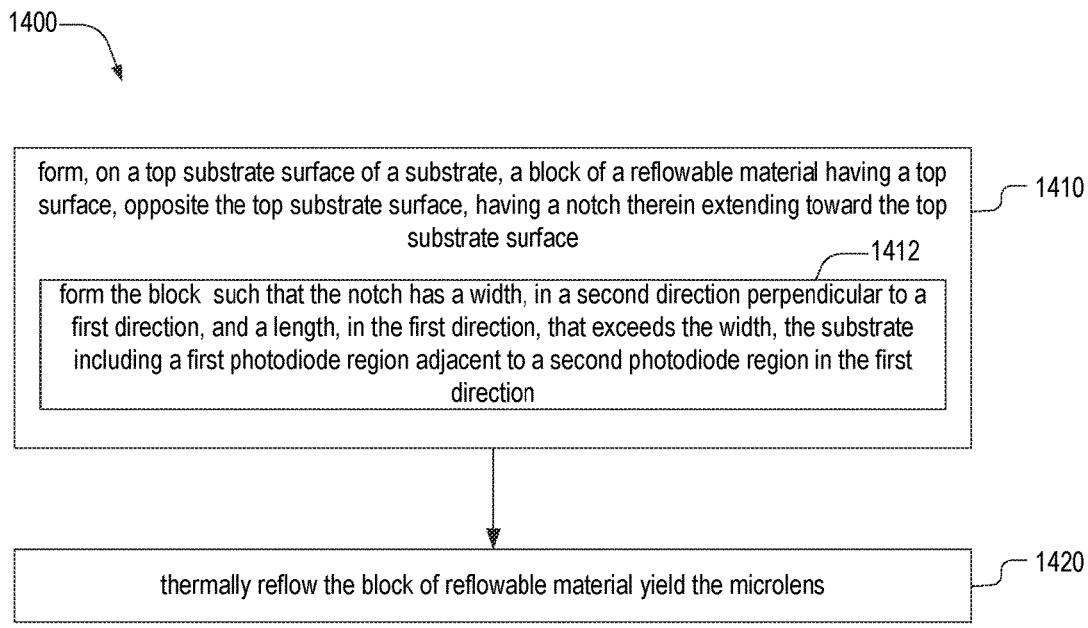
FIG. 14 is a flowchart illustrating a method for forming a microlens, in an embodiment.

FIG. 14 is a flowchart illustrating a method 1400 for forming a microlens. Method 1400 includes steps 1410 and 1420. Step 1410 is one of forming, on a top substrate surface of a substrate, a block of a reflowable material having a top surface, opposite the top substrate surface, having a notch therein extending toward the top substrate surface. In an example, of step 1410, notched block 1100 is formed on top surface 240T of filter 240, as shown in FIGS. 11-12. Notched block 1100 includes notch 1100, which extends from top surface 1100T toward top surface 240T.

Step 1410 may also include a step 1412, for example, when the substrate includes a first photodiode region adjacent to a second photodiode region in a first direction. Step 1412 is one of forming the block such that the notch has a width, in a second direction perpendicular to the first direction, and a length, in the first direction, that exceeds the width. In an example of step 1412, photodiode regions are side adjacent in the x-direction and notched block 1100 is formed on top surface 240T of filter 240 such that trench 1110 is length-wise oriented and parallel to the x-direction.

Step 1420 is one of thermally reflowing the block of material to yield the microlens. In an example of step 1420, notched block 1100 is thermally reflowed to yield microlens 450, FIGS. 4-7.

Features described above as well as those claimed below may be combined in various ways without departing from the scope hereof. The following examples illustrate some possible, non-limiting combinations:

(A1) An image sensor includes a multi-pixel detector. The multi-pixel detector includes a first pixel formed in a substrate and having a first photodiode region, a second pixel formed in the substrate adjacent to the first pixel and having a second photodiode region, and a microlens above both the first pixel and the second pixel. The microlens includes (a) in a first cross-sectional plane perpendicular to a top surface of the substrate and including both the first and the second photodiode regions, a first height profile having $N_1$ local maxima, and (b) in a second cross-sectional plane perpendicular to the first cross-sectional plane and the top surface and including only one of the first and the second photodiode regions, a second height profile having $N_2 > N_1$ local maxima.

(A2) In an image sensor denoted by (A1), the first height profile may have $N_1 = 1$ local maxima and be characterized by first radius of curvature $R_1$. The second height profile may include a first local maxima and a second local maxima corresponding to respective radii of curvature $R_{21} < R_1$ and $R_{22} < R_1$.

(A3) In any image sensor denoted by (A2), the radius of curvature may satisfy $R_1 = 730 \pm 70$ nanometers.

(A4) In any image sensor denoted by one of (A2) and (A3), the radii of curvature $R_{21}$ and $R_{22}$ may be equal to within ten percent of $(R_{21} + R_{22})/2$.

(A5) In any image sensor denoted by one of (A2) through (A4), the radii of curvature $R_{21}$ and $R_{22}$ may be equal to $580 \pm 60$ nm.

(A6) In any image sensor denoted by one of (A1) through (A5), the microlens may have a maximum thickness of $730 \pm 70$ nanometers.

(B1) denotes a method for increasing angular sensitivity of a multi-pixel detector to light incident thereon, the multi-pixel detector having a substrate that includes a first photodiode region adjacent to a second photodiode region in a first direction. The method (B1) includes a step of imparting a phase shift on the light such that the light has, in a cross-sectional plane intersecting the substrate, parallel to a top surface of the substrate, and including the first direction, an oblong intensity distribution that has (i) a first width in the first direction and (ii) in a second direction perpendicular to the first direction and in the cross-sectional plane, a second width the exceeds the first width.

(B2) In method (B1), the phase shift may have (i) in the first direction, an absolute value having $N_1$ local maxima and (ii) in the second direction, an absolute value having $N_2 > N_1$ local maxima.

(C1) denotes a method for forming a microlens. The method (C1) includes forming, on a top substrate surface of a substrate, a block of a reflowable material having a top block surface, opposite the top substrate surface, having a notch therein extending toward the top substrate surface. The method also includes thermally reflowing the block of reflowable material to yield the microlens.

(C2) In method (C1), in which the substrate includes a first photodiode region adjacent to a second photodiode region in a first direction, the step of forming may include forming the block such that the notch has a width, in a second direction perpendicular to the first direction, and a length, in the first direction, that exceeds the width.

(C3) In any method denoted by one of (C1) and (C2), the microlens may have properties of the microlens of any of the image sensors denoted by one of (A1) through (A6).

Changes may be made in the above image sensors, multi-pixel detectors, and related methods without departing from the scope hereof. It should thus be noted that the matter contained in the above description or shown in the accompanying drawings should be interpreted as illustrative and not in a limiting sense. Herein, and unless otherwise indicated, the adjective "exemplary" means serving as an example, instance, or illustration. The following claims are intended to cover all generic and specific features described herein, as well as all statements of the scope of the present methods, image sensors, and detectors, which, as a matter of language, might be said to fall therebetween.

What is claimed is:

1. An image sensor with a multi-pixel detector, comprising:
   a first pixel formed in a substrate and having a first photodiode region;
   a second pixel formed in the substrate adjacent to the first pixel and having a second photodiode region; and
   a microlens above both the first pixel and the second pixel and having
   (a) in a first cross-sectional plane perpendicular to a top surface of the substrate and including both the first and the second photodiode regions, a first height profile having $N_1$ local maxima, $N_1 \geq 1$, and
   (b) in a second cross-sectional plane perpendicular to the first cross-sectional plane and the top surface and including only one of the first and the second photodiode regions, a second height profile having $N_2 > N_1$ local maxima.

2. The image sensor of claim 1,
   the first height profile having $N_1 = 1$ local maxima and being characterized by first radius of curvature $R_1$; and
   the second height profile including a first local maxima and a second local maxima corresponding to respective radii of curvature $R_{21} < R_1$ and $R_{22} < R_1$.

3. The image sensor of claim 2, the radius of curvature $R_1 = 730 \pm 70$ nanometers.

4. The image sensor of claim 2, the radii of curvature $R_{21}$ and $R_{22}$ being equal to within ten percent of $(R_{21} + R_{22})/2$.

5. The image sensor of claim 2, the radii of curvature $R_{21}$ and $R_{22}$ being equal to $580 \pm 60$ nm.

6. The image sensor of claim 1, the microlens having a maximum thickness of $730 \pm 70$ nanometers.

* * * * *